US012567720B2

(12) United States Patent
Dolganov et al.

(10) Patent No.: US 12,567,720 B2
(45) Date of Patent: Mar. 3, 2026

(54) DRIVER CIRCUIT FOR AN ADDRESSABLE ARRAY OF OPTICAL EMITTERS

(71) Applicant: Lumentum Operations LLC, San Jose, CA (US)

(72) Inventors: Mikhail Dolganov, San Jose, CA (US); Lijun Zhu, Dublin, CA (US)

(73) Assignee: Lumentum Operations LLC, San Jose, CA (US)

( * ) Notice: Subject to any disclaimer, the term of this patent is extended or adjusted under 35 U.S.C. 154(b) by 987 days.

(21) Appl. No.: 17/660,108

(22) Filed: Apr. 21, 2022

(65) Prior Publication Data

US 2023/0299555 A1     Sep. 21, 2023

Related U.S. Application Data

(60) Provisional application No. 63/269,567, filed on Mar. 18, 2022.

(51) Int. Cl.
| | |
|---|---|
| *H01S 5/042* | (2006.01) |
| *G01S 7/481* | (2006.01) |
| *G01S 7/484* | (2006.01) |
| *H01S 5/42* | (2006.01) |
| *H03K 17/687* | (2006.01) |

(52) U.S. Cl.
CPC .......... *H01S 5/0428* (2013.01); *G01S 7/4815* (2013.01); *G01S 7/484* (2013.01); *H01S 5/423* (2013.01); *H03K 17/6871* (2013.01)

(58) Field of Classification Search
None
See application file for complete search history.

(56) References Cited

U.S. PATENT DOCUMENTS

| | | | | | |
|---|---|---|---|---|---|
| 6,222,352 | B1 * | 4/2001 | Lenk | ................... | H02M 3/1588 |
| | | | | | 323/267 |
| 7,432,614 | B2 * | 10/2008 | Ma | ........................ | H02M 3/158 |
| | | | | | 307/31 |
| 8,610,371 | B2 * | 12/2013 | Lee | ........................ | H05B 45/46 |
| | | | | | 315/294 |
| 8,884,593 | B2 * | 11/2014 | Su | ........................ | H02M 3/158 |
| | | | | | 323/275 |
| 8,896,214 | B2 * | 11/2014 | Xu | ........................ | H05B 45/38 |
| | | | | | 315/192 |
| 10,147,583 | B2 * | 12/2018 | Cho | ...................... | H01J 37/243 |

(Continued)

FOREIGN PATENT DOCUMENTS

CN          111244752 A  *  6/2020  ........... G01S 7/4814

*Primary Examiner* — Tod T Van Roy
(74) *Attorney, Agent, or Firm* — Harrity & Harrity, LLP

(57) ABSTRACT

In some implementations, a controller may cause a first switch of a driver circuit to transition from an open state to a closed state to charge an inductive element of the driver circuit. The controller may cause the first switch to transition from the closed state to the open state to discharge the inductive element. The controller may cause a second switch of the driver circuit to transition from an open state to a closed state to select a capacitive element to be charged by discharging the inductive element. The controller may cause a third switch of the driver circuit to transition from an open state to a closed state to discharge the selected capacitive element to provide an electrical pulse to an optical emitter, of an array of optical emitters of the driver circuit, that is connected to the selected capacitive element.

20 Claims, 4 Drawing Sheets

100

(56) References Cited

U.S. PATENT DOCUMENTS

| | | | | |
|---|---|---|---|---|
| 10,170,990 B2 * | 1/2019 | Calhoun | ................ | H02M 3/158 |
| 10,903,621 B2 * | 1/2021 | Stern | .................... | H01S 5/0428 |
| 11,245,247 B2 * | 2/2022 | Colles | .................. | H01S 5/0261 |
| 11,923,658 B1 * | 3/2024 | Lenius | .................. | H05B 47/00 |
| 12,266,905 B2 * | 4/2025 | Colles | .................... | G01S 7/484 |
| 2010/0283322 A1 * | 11/2010 | Wibben | ................ | H02M 3/158 |
| | | | | 307/31 |
| 2013/0154484 A1 * | 6/2013 | Xu | ........................ | H05B 45/46 |
| | | | | 315/122 |
| 2014/0211192 A1 * | 7/2014 | Grootjans | ............... | G01S 17/10 |
| | | | | 356/5.01 |
| 2020/0006915 A1 * | 1/2020 | Moeneclaey | .......... | H01S 5/183 |
| 2020/0178361 A1 * | 6/2020 | Oka | ...................... | G01S 7/4815 |
| 2021/0333362 A1 * | 10/2021 | Huang | .................... | G01S 17/10 |
| 2022/0137230 A1 * | 5/2022 | Schleuning | .......... | G01S 17/931 |
| | | | | 340/435 |
| 2022/0299604 A1 * | 9/2022 | Dolganov | ............... | G01S 17/89 |
| 2022/0299610 A1 * | 9/2022 | Dolganov | ............... | G01S 17/89 |
| 2023/0021526 A1 * | 1/2023 | Dolganov | ............. | G01S 7/4865 |
| 2023/0132592 A1 * | 5/2023 | Chen | .................... | G01S 7/4815 |
| | | | | 356/5.01 |
| 2023/0299555 A1 * | 9/2023 | Dolganov | ............... | H01S 5/423 |
| | | | | 372/27 |

* cited by examiner

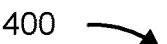

400

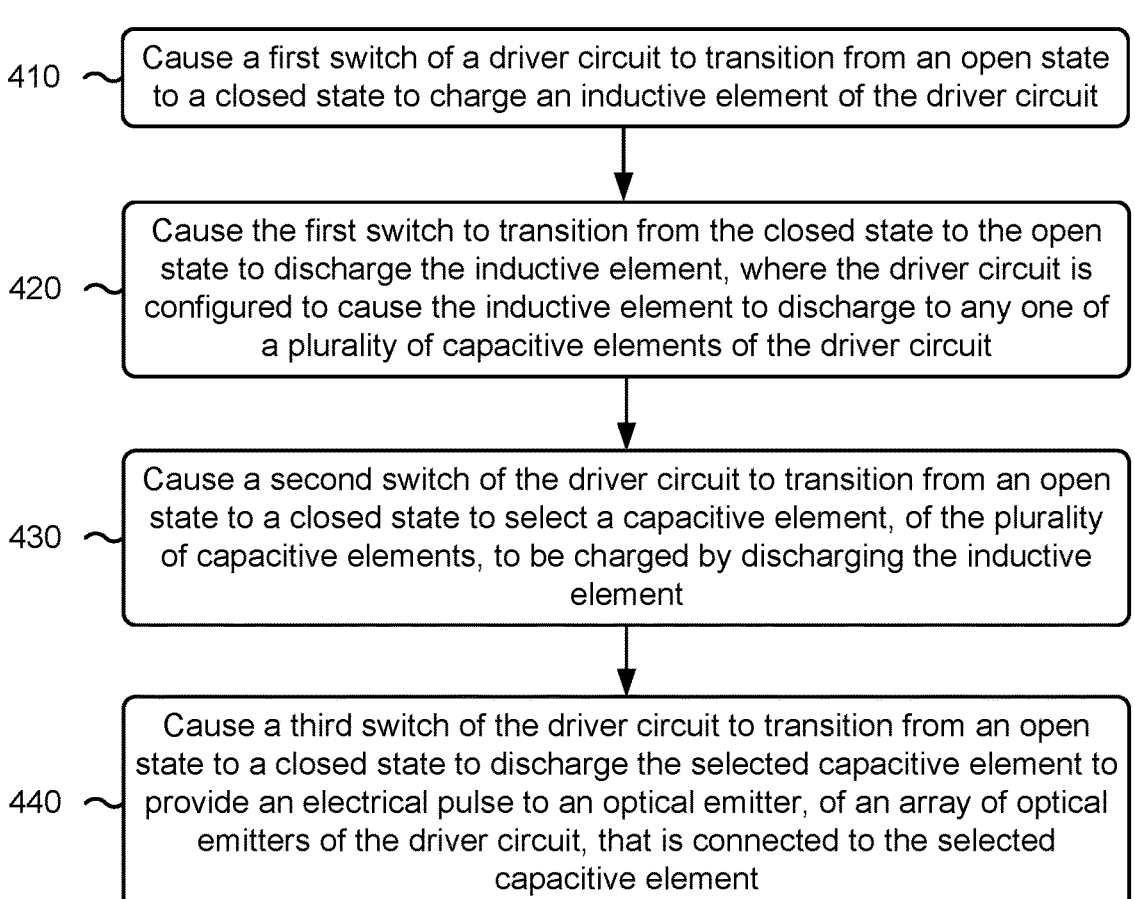

410 — Cause a first switch of a driver circuit to transition from an open state to a closed state to charge an inductive element of the driver circuit 420 — Cause the first switch to transition from the closed state to the open state to discharge the inductive element, where the driver circuit is configured to cause the inductive element to discharge to any one of a plurality of capacitive elements of the driver circuit 430 — Cause a second switch of the driver circuit to transition from an open state to a closed state to select a capacitive element, of the plurality of capacitive elements, to be charged by discharging the inductive element 440 — Cause a third switch of the driver circuit to transition from an open state to a closed state to discharge the selected capacitive element to provide an electrical pulse to an optical emitter, of an array of optical emitters of the driver circuit, that is connected to the selected capacitive element

FIG. 4

DRIVER CIRCUIT FOR AN ADDRESSABLE ARRAY OF OPTICAL EMITTERS

CROSS-REFERENCE TO RELATED APPLICATION

This Patent Application claims priority to U.S. Provisional Patent Application No. 63/269,567, filed on Mar. 18, 2022, and entitled "ONE-DIMENSIONAL VERTICAL CAVITY SURFACE EMITTING LASER ARRAY DRIVER" The disclosure of the prior Application is considered part of and is incorporated by reference into this Patent Application.

TECHNICAL FIELD

The present disclosure relates generally to an addressable array of optical emitters and to a driver circuit for an addressable array of optical emitters.

BACKGROUND

Light detection and ranging (LIDAR) systems, such as time-of-flight (ToF)-based measurement systems, emit optical pulses, detect reflected optical pulses, and determine distances to objects by measuring delays between the emitted optical pulses and the reflected optical pulses.

SUMMARY

In some implementations, a driver circuit includes a one-dimensional array of vertical cavity surface emitting lasers (VCSELs); a plurality of capacitive elements connected to respective VCSELs of the array of VCSELs; an inductive element; a first switch having an open state and a closed state, where the first switch in the closed state is to cause a charging of the inductive element, and where the first switch transitioning from the closed state to the open state is to cause a discharging of the inductive element; a plurality of second switches, each having an open state and a closed state, between the inductive element and the plurality of capacitive elements, where the plurality of second switches are connected to respective capacitive elements of the plurality of capacitive elements, and where a second switch, of the plurality of second switches, in the closed state is to select a capacitive element, of the plurality of capacitive elements, that is to be charged by the discharging of the inductive element; and a third switch, having an open state and a closed state, to control current to the array of VCSELs, where the third switch in the closed state is to cause a discharging of the selected capacitive element to provide an electrical pulse to a VCSEL, of the array of VCSELs, that is connected to the selected capacitive element.

In some implementations, an optical source includes an array of optical emitters; a plurality of capacitive elements connected to respective optical emitters of the array of optical emitters; an inductive element; a first switch having an open state and a closed state, where the first switch in the closed state is to cause a charging of the inductive element, and where the first switch transitioning from the closed state to the open state is to cause a discharging of the inductive element; a plurality of second switches, each having an open state and a closed state, between the inductive element and the plurality of capacitive elements, where the plurality of second switches are connected to respective capacitive elements of the plurality of capacitive elements, and where a second switch, of the plurality of second switches, in the closed state is to select a capacitive element, of the plurality of capacitive elements, that is to be charged by the discharging of the inductive element; and a third switch, having an open state and a closed state, to control current to the array of optical emitters, where the third switch in the closed state is to cause a discharging of the selected capacitive element to provide an electrical pulse to an optical emitter, of the array of optical emitters, that is connected to the selected capacitive element.

In some implementations, a method includes causing, by a controller, a first switch of a driver circuit to transition from an open state to a closed state to charge an inductive element of the driver circuit; causing, by the controller, the first switch to transition from the closed state to the open state to discharge the inductive element, where the driver circuit is configured to cause the inductive element to discharge to any one of a plurality of capacitive elements of the driver circuit; causing, by the controller, a second switch of the driver circuit to transition from an open state to a closed state to select a capacitive element, of the plurality of capacitive elements, to be charged by discharging the inductive element; and causing, by the controller, a third switch of the driver circuit to transition from an open state to a closed state to discharge the selected capacitive element to provide an electrical pulse to an optical emitter, of an array of optical emitters of the driver circuit, that is connected to the selected capacitive element.

BRIEF DESCRIPTION OF THE DRAWINGS

FIG. 4 is a flowchart of an example process relating to controlling a driver circuit for an addressable array of optical emitters.

DETAILED DESCRIPTION

The following detailed description of example implementations refers to the accompanying drawings. The same reference numbers in different drawings may identify the same or similar elements.

LIDAR systems, such as ToF-based measurement systems (e.g., direct ToF LIDAR systems), require high power optical pulses of short duration (e.g., 10 nanoseconds (ns) or less). High peak power optical pulses may enable greater distance range finding. Optical pulses with faster rise times may enable improved resolution. Shorter duration optical pulses may reduce power consumption and improve efficiency of a LIDAR system. For a laser-based optical load (e.g., a laser diode, a semiconductor laser diode, a vertical-cavity surface-emitting laser (VCSEL), or the like), a higher electrical current across the optical load corresponds to a higher power optical pulse. As noted, ToF-based measurement systems may determine distances to objects by measuring delays between emitted optical pulses and reflected optical pulses. Emitting pulses having a well-defined origin in time simplifies the measurements. Moreover, miniaturization of a LIDAR system may facilitate inclusion of the LIDAR system in devices with small form factor. However, in general, LIDAR systems may be unable to emit pulses having a well-defined origin in time and/or may be bulky.

Some implementations described herein provide a driver circuit for an array of optical emitters (e.g., VCSELs). The driver circuit may be used in a LIDAR system. In some implementations, the driver circuit includes a one-dimensional array of optical emitters (e.g., arranged in multiple rows). In some examples, however, the driver circuit may include a two-dimensional array of optical emitters. The driver circuit may include a plurality of capacitive elements connected to respective optical emitters of the array. Moreover, the driver circuit may include a voltage booster circuit that includes an inductive element that is configured to discharge to a selected capacitive element of the plurality of capacitive elements, thereby charging the capacitive element. Thus, discharging of the capacitive element provides an electrical pulse to the optical emitter that is connected to the capacitive element.

In this way, the driver circuit is capable of producing high speed optical pulses with fast rise times. In addition, the voltage booster circuit of the driver circuit may be common to the plurality of capacitive elements, thereby simplifying and facilitating miniaturization of the driver circuit. Furthermore, the common voltage booster circuit enables real-time adjustment of voltage levels supplied to the array of optical emitters to provide compensation for the different inductances of the current paths of each optical emitter. Thus, peak optical powers may be equalized among the optical emitters, which improves a performance of a LIDAR system that uses the driver circuit.

Figure 1:
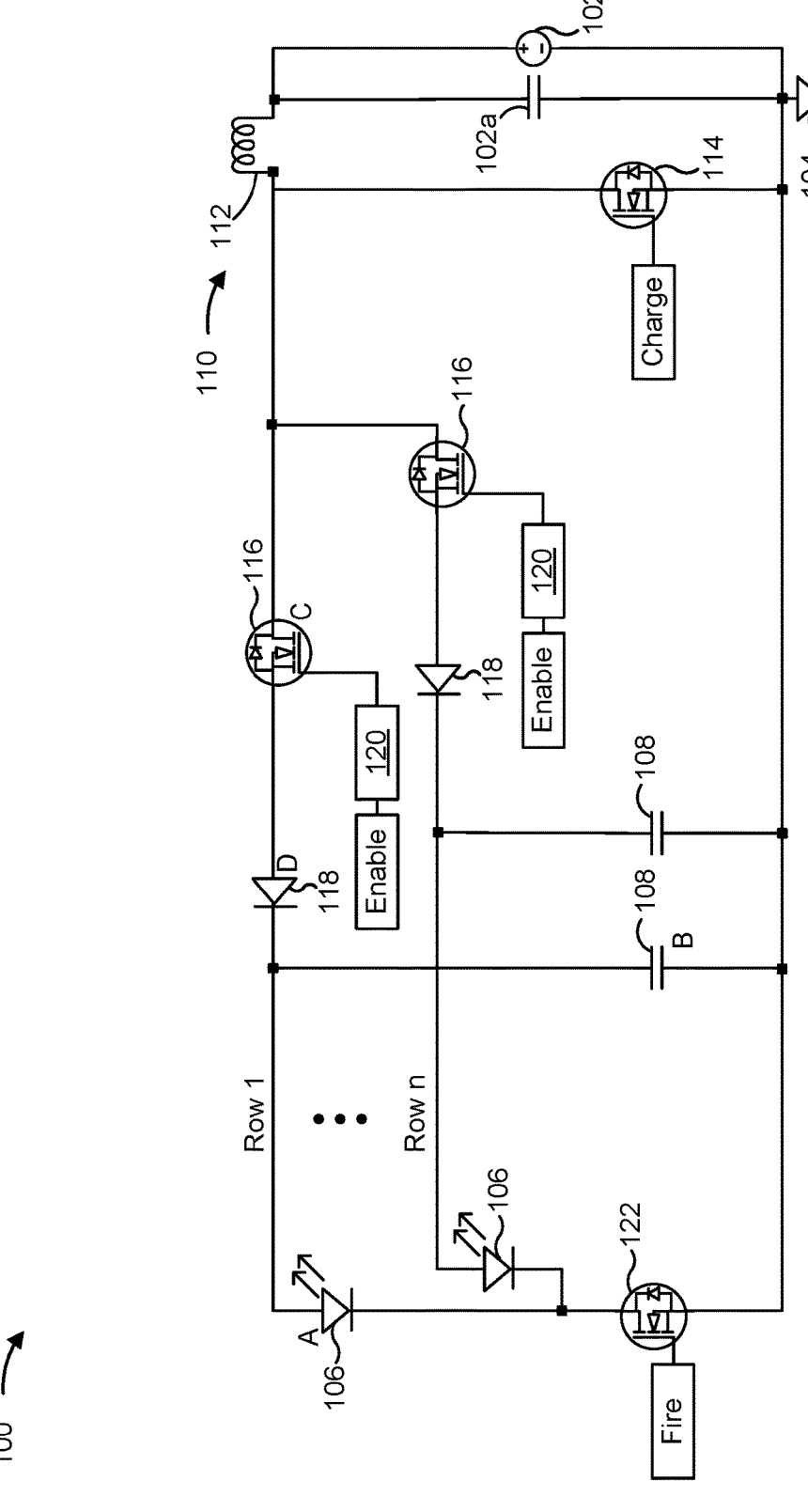
FIG. 1 is a diagram of an example driver circuit.

FIG. 1 is a diagram of an example driver circuit 100. The driver circuit 100 may include a set of electronic components, as described herein, interconnected by current-carrying conductors (e.g., traces). The driver circuit 100 may include a source 102. The source 102 may provide an electrical input of the driver circuit 100. For example, the source 102 may provide current to the driver circuit 100. The source 102 may be a direct current (DC) voltage source or a DC current source with a resistive load, among other examples. In some implementations, the driver circuit 100 may include a capacitive element 102a (e.g., one or more capacitors) connected to the source 102. The driver circuit 100 may include a ground 104.

The driver circuit 100 may include an array of optical emitters 106. The array of optical emitters 106 may include a plurality of optical emitters 106. An optical emitter 106 may include a light-emitting diode (LED), a laser diode, a semiconductor laser diode, a VCSEL, and/or an edge-emitting emitter (e.g., an edge-emitting laser), among other examples. The array of optical emitters 106 may be a one-dimensional array. For example, the array of optical emitters 106 may be arranged into a single column that includes a plurality of rows (shown as Rows 1 through n). As an example, the array of optical emitters 106 may include 10 or more rows, 12 or more rows, 15 or more rows, or the like. In some implementations, the array of optical emitters 106 may be a two-dimensional array whereby the optical emitters 106 are arranged into a plurality of rows and a plurality of columns. In an example used throughout the description of FIG. 1, the array of optical emitters 106 may include an optical emitter 106 A associated with Row 1 of the array of optical emitters 106.

The driver circuit 100 may include a plurality of capacitive elements 108 (e.g., capacitive voltage sources). A capacitive element 108 may include one or more capacitors configured to store energy in response to current flowing through the capacitor(s), and configured to discharge the stored energy from the capacitor(s). In some implementations, a capacitive element 108 may include a discrete capacitor component and/or a capacitive element 108 may be formed in a substrate of the driver circuit 100 (e.g., to improve compactness of the driver circuit 100 and reduce parasitic inductance). A capacitive element 108 may have an electrical capacitance in a range from about (e.g., ±1%) 1 nanofarad to about 100 nanofarads.

Each row of the array of optical emitters 106 may be connected to (e.g., in a circuit path with) a respective capacitive element 108 (e.g., at an anode side of the array of optical emitters 106). That is, the plurality of capacitive elements 108 may be connected to respective optical emitters 106 of the array of optical emitters 106. For example, a capacitive element 108 B may be connected to Row 1. Thus, each capacitive element 108 operates as a voltage source for a particular row (e.g., a particular anode row) of the array of optical emitters 106.

In some implementations, a capacitive element 108 may be directly connected to an optical emitter 106 (e.g., to an anode of the optical emitter 106) of a row of the array of optical emitters 106. That is, the capacitive element 108 may be directly connected to the row. For example, no other circuit components may be in a circuit path between the capacitive element 108 and the optical emitter 106 of the row. In some implementations, a pitch of the leads for the capacitive element 108 may be the same as (e.g., may match) the pitch of the leads for the optical emitter 106. In this way, the capacitive element 108 may be located as close as possible to the corresponding optical emitter 106, thereby facilitating equalization and minimization of current loops for the array of optical emitters 106.

The driver circuit 100 may include a voltage booster element 110. The voltage booster element 110 may include an inductive element 112 (e.g., that is to boost an input voltage of the driver circuit 100). The voltage booster element 110 may also include the source 102 and/or the capacitive element 102a. The inductive element 112 may include an inductor configured to store energy in response to current flowing through the inductor, and configured to discharge the stored energy from the inductor as current. In some implementations, the inductive element 112 may include one or more inductors. The inductive element 112 may have an electrical inductance in a range from about 0.5 nanohenry (nH) to about 10 microhenry (μH). The voltage booster element 110 (e.g., the inductive element 112) may be common to (e.g., shared by) the plurality of capacitive elements 108. For example, the plurality of capacitive elements 108 may be connected to (e.g., in a circuit path with) the voltage booster element 110 (e.g., the inductive element 112). In this way, the voltage booster element 110 operates as a current source for each of the capacitive elements 108.

The driver circuit 100 may include a first switch 114 (which may be referred to herein as a charging switch 114). The charging switch 114 may also be part of the voltage booster element 110. The inductive element 112 of the voltage booster element 110 may be connected to (e.g., in a circuit path with) the charging switch 114. As described below, the charging switch 114 may control charging of the inductive element 112. The charging switch 114 may be a field effect transistor (FET). For example, the FET may be a gallium nitride (GaN) FET, a complementary metal-oxide-semiconductor (CMOS) FET, or the like. As shown, a charging circuit path of the driver circuit 100 may include the source 102 (and/or the capacitive element 102a), the inductive element 112, and the charging switch 114.

The charging switch 114 may have a closed state (e.g., an on state) where, when the charging switch 114 is in the closed state, current may flow through the charging switch 114. Additionally, the charging switch 114 may have an open state (e.g., an off state), where, when the charging switch 114 is in the open state, current may not flow through the charging switch 114. The state of the charging switch 114 may be controlled by a "charge" signal that is provided to the charging switch 114 (e.g., by a controller). The charging switch 114 may transition to, and remain in, the closed state when the charge signal is at a first voltage level (e.g., a high voltage level). The charging switch 114 may transition to, and remain in, the open state when the charge signal is at a second voltage level (e.g., a low voltage level).

In the closed state, the charging switch 114 may cause current to charge the inductive element 112 connected to the charging switch 114 (e.g., by completing a circuit path that includes the source 102, the inductive element 112, and the charging switch 114). That is, when the charging switch 114 is in the closed state, current may flow through the charging switch 114 and charge the inductive element 112.

In some implementations, when the charging switch 114 is in the closed state, current may flow through the charging switch 114 and charge the inductive element 112 for a duration (e.g., a charging time interval). The duration may be in a range from about 50 ns to about 150 ns, about 80 ns to about 120 ns, or about 100 ns to about 110 ns, among other examples. Moreover, a duration for which the inductive element 112 is charged (e.g., a duration for which the charging switch 114 is in the closed state) may be variable (e.g., to achieve a desired peak optical power) based on a particular capacitive element 108 (e.g., based on a capacitance value of the capacitive element 108) that is to be charged by discharging of the inductive element 112. For example, the duration may be based on a length of a circuit path (e.g., a laser current path) associated with a particular optical emitter 106 that is to be illuminated. The circuit path may include the particular optical emitter 106, a corresponding capacitive element 108 (e.g., connected to the row of the optical emitter 106), and a discharging switch 122 (described below). In this way, by controlling (e.g., in real time) the charging time interval of the inductive element 112, control of the current level for each optical emitter 106 in the array may be achieved. Accordingly, the driver circuit 100 may compensate for the different inductances of each circuit path of the array of optical emitters 106, to thereby equalize peak optical power across the array of optical emitters 106.

When transitioning from the closed state to the open state, the charging switch 114 may cause discharging of the inductive element 112. That is, when the charging switch 114 is in the open state, current may not flow through the charging switch 114, and current discharges from the inductive element 112. The driver circuit 100 may be configured such that the inductive element 112 can discharge to any one of the capacitive elements 108 (e.g., based on which of the capacitive elements 108 is selected, as described below).

The driver circuit 100 may include a plurality of second switches 116 (which may be referred to herein as enabling switches 116). The driver circuit 100 may also include a plurality of blocking diodes 118 between the plurality of enabling switches 116 and the plurality of capacitive elements 108. For example, a blocking diode 118 D may be connected between the enabling switch 116 C and the capacitive element 108 B. In this way, the blocking diodes 118, as well as the enabling switches 116, may isolate anodes of the optical emitters 106 to reduce crosstalk. The enabling switches 116 may be located between the inductive element 112 and the plurality of capacitive elements 108 (e.g., between the inductive element 112 and the plurality of blocking diodes 118). The enabling switches 116 may be connected to respective capacitive elements 108 (e.g., via the blocking diodes 118). For example, an enabling switch

116 C may be connected to the capacitive element 108 B (e.g., via the blocking diode 118 D). The enabling switches 116 may control which capacitive element 108 is to be charged by the discharging of the inductive element 112. The enabling switches 116 may be FETs, such as GaN FETs, CMOS FETs, or the like. In some implementations, the enabling switches 116 are high side switches.

As shown, enabling circuit paths of the driver circuit 100 may include the inductive element 112, an enabling switch 116, a blocking diode 118, and a capacitive element 108. For example, a first enabling circuit path of the driver circuit 100 may include the inductive element 112, a first enabling switch 116, a first blocking diode 118, and a first capacitive element 108; a second enabling circuit path of the driver circuit 100 may include the inductive element 112, a second enabling switch 116, a second blocking diode 118, and a second capacitive element 108; and so forth. As shown, for an array that includes multiple rows of optical emitters 106, the driver circuit 100 may include a set of an enabling switch 116, a blocking diode 118, and a capacitive element 108 for each row, while the inductive element 112 is shared among the rows.

Each enabling switch 116 may have a closed state (e.g., an on state) where, when the enabling switch 116 is in the closed state, current may flow through the enabling switch 116. Additionally, each enabling switch 116 may have an open state (e.g., an off state), where, when the enabling switch 116 is in the open state, current may not flow through the enabling switch 116. The state of an enabling switch 116 may be controlled by an "enable" signal that is provided to the enabling switch 116 (e.g., by a controller). The enabling switch 116 may transition to, and remain in, the closed state when the enable signal is at a first voltage level (e.g., a high voltage level). The enabling switch 116 may transition to, and remain in, the open state when the enable signal is at a second voltage level (e.g., a low voltage level). In some implementations, the enable signal may be an inverse of the charge signal described above. In this way, a timing between completion of the charging of the inductive element 112 and initiating charging of a capacitive element 108 may be minimized, thereby facilitating a fast pulse repetition rate.

In the closed state, an enabling switch 116 may select a capacitive element 108, connected to the enabling switch 116, that is to be charged by the discharging of the inductive element 112 (e.g., by completing a circuit path that includes the inductive element 112, the enabling switch 116, and the capacitive element 108). For example, when the enabling switch 116 C is in the closed state, the capacitive element 108B is selected to be charged by the discharging of the inductive element 112. Thus, the enabling switches 116 control which capacitive element 108 is to be charged when the inductive element 112 is discharged. Thus, when one enabling switch 116 is in the closed state to select a capacitive element 108 to be charged, the other enabling switches 116 may be in the open state. In this way, only a single capacitive element 108 may be charged from the discharging of the inductive element 112.

In some implementations, the driver circuit 100 may include a plurality of gate drivers 120 that are respectively connected to the enabling switches 116. A gate driver 120 may control a gate of an enabling switch 116 to control the state of the enabling switch 116. For example, the gate driver 120 may receive the enable signal for the enabling switch 116, and the gate driver 120 may control the gate of the enabling switch 116 based on the enable signal. In some implementations, a gate driver 120 for an enabling switch 116 is a high side gate driver.

The driver circuit 100 may include a third switch 122 (which may be referred to herein as a discharging switch 122). A column (e.g., the single column) of the array of optical emitters 106 may be connected to (e.g., in a circuit path with) the discharging switch 122. As described below, the discharging switch 122 may control discharging of a charged capacitive element 108 through the column of the array (e.g., by completing a cathode path of the column). That is, the discharging switch 122 may control current to the array of optical emitters 106. The discharging switch 122 may be a FET (e.g., an n-type FET). For example, the FET may be a GaN FET, a CMOS FET, or the like. In some implementations, the discharging switch 122 is a low side switch. In some implementations, the discharging switch 122 may be capable of operation in a closed state (e.g., capable of transitioning from an open state to a closed state, and subsequently transitioning from the closed state to the open state) for a time duration in a range from about 0.5 ns to about 10 ns. In some implementations, the discharging switch 122 may be a high-speed switch (e.g., may have a faster switching speed than the charging switch 114 or an enabling switch 116). For example, the discharging switch 122 may be the only high-speed switch of the driver circuit 100, thereby simplifying the driver circuit 100.

As shown, discharging circuit paths of the driver circuit 100 may include a capacitive element 108, an optical emitter 106, and the discharging switch 122. For example, a first discharging circuit path of the driver circuit 100 may include a first capacitive element 108 of a first row, a first optical emitter 106 of the first row, and the discharging switch 122; a second discharging circuit path of the driver circuit 100 may include a second capacitive element 108 of a second row, a second optical emitter 106 of the second row, and the discharging switch 122; and so forth. In implementations in which the driver circuit 100 includes a two-dimensional array of optical emitters 106, the driver circuit 100 may include multiple discharging switches 122 respectively connected to each column of the array, and each discharging switch 122 may control selection of a column of the array to receive current for discharging of a capacitive element 108. In some implementations, the driver circuit 100 may include multiple discharging switches 122 in parallel at the cathode side of the array of optical emitters 106 to improve equalization of current loop paths across the array of optical emitters 106.

The discharging switch 122 may have a closed state (e.g., an on state) where, when the discharging switch 122 is in the closed state, current may flow through the discharging switch 122. Additionally, the discharging switch 122 may have an open state (e.g., an off state), where, when the discharging switch 122 is in the open state, current may not flow through the discharging switch 122. The state of the discharging switch 122 may be controlled by a "fire" signal that is provided to the discharging switch 122 (e.g., by a controller). The discharging switch 122 may transition to, and remain in, the closed state when the fire signal is at a first voltage level (e.g., a high voltage level). The discharging switch 122 may transition to, and remain in, the open state when the fire signal is at a second voltage level (e.g., a low voltage level).

The discharging switch 122 in the closed state may cause discharging, of a charged capacitive element 108 of a row, through the row to provide an electrical pulse (e.g., with high peak current) to an optical emitter 106 associated with the row. For example, in the closed state, the discharging switch 122 may close (e.g., complete) a cathode path of the column of the array (e.g., current may flow through an optical emitter 106 of a row associated with a charged capacitive element 108 when the discharging switch 122 is in the closed state). Stated differently, in the closed state, the discharging switch 122 may complete a circuit path that includes the column of the array. In the open state of the discharging switch 122, current is not provided to the array of optical emitters 106 (e.g., by opening the cathode path of the column of the array).

In some implementations, when the discharging switch 122 is in the closed state, a capacitive element 108 may be discharged for a duration (e.g., a discharging time interval). The duration may be in a range from about 1 ns to about 10 ns, about 1 ns to about 5 ns, or the like. In this way, the driver circuit 100 may be used to address different optical emitters 106 of the array of optical emitters 106. Moreover, the duration for which the discharging switch 122 is in the closed state to cause discharging of the capacitive element 108 may be sufficient (e.g., with respect to a capacitance value of the capacitive element 108) to allow for discharging of the capacitive element 108 below a lasing voltage threshold of an optical emitter 106. In this way, a capacitive element 108 may be discharged before another capacitive element 108 is subsequently charged, thereby preventing illumination of multiple optical emitters 106 at the same time.

In an example operation of the driver circuit 100, the charging switch 114 may transition from the open state to the closed state (e.g., in response to the first voltage level of the charge signal, as described herein) to cause current (e.g., from the source 102) to charge the inductive element 112 (e.g., for a particular duration). Continuing with the example, the charging switch 114 may transition from the closed state to the open state (e.g., in response to the second voltage level of the charge signal) to cause the inductive element 112 to discharge current. Concurrently, or near-concurrently, with the charging switch 114 transitioning to the open state, the enabling switch 116 C may transition from the open state to the closed state (e.g., in response to the first voltage level of the enable signal) to cause discharging of the inductive element 112 through the enabling switch 116 C and to cause charging of the capacitive element 108 B (e.g., via the blocking diode 118 D) connected to the enabling switch 116 C. Concurrently with the charging of the capacitive element 108 B, or upon completion thereof, the discharging switch 122 may transition from the open state to the closed state (e.g., in response to the first voltage level of the fire signal) to cause discharging of the capacitive element 108 B (e.g., a discharge of energy from the capacitive element 108 B) through Row 1 to provide an electrical pulse (e.g., a high-speed electrical pulse) to the optical emitter 106 A. In response to the electrical pulse, the optical emitter 106 A may emit an optical pulse (e.g., having a duration in a range from about 1 ns to about 10 ns, about 1 ns to about 5 ns, or the like). In some implementations, the duration for which the inductive element 112 is charged may be based on a length of a circuit path associated with the optical emitter 106 A. The circuit path may include the optical emitter 106 A, the capacitive element 108 B, and the discharging switch 122.

In some implementations, operation of the driver circuit 100 may include charging the capacitive elements 108 (and subsequently discharging the capacitive elements 108) one at a time (e.g., one-by-one). The capacitive elements 108 may be charged in sequence or in a non-sequential order. After a capacitive element 108 is charged (e.g., upon completion of charging the capacitive element 108), the discharging switch 122 may transition from the open state to the closed state to cause discharging of the capacitive element 108 and to activate an optical emitter 106 connected to the capacitive element 108 (e.g., of the same channel as the capacitive element 108). Thereafter, a different capacitive element 108 may be charged, and so forth. In some implementations, multiple capacitive elements 108 may be charged, one at a time, without being discharged one at a time (e.g., the capacitive elements 108 are to hold the charge until all of the multiple capacitive elements 108 have been charged). After the multiple capacitive elements 108 have been charged (e.g., upon completion of charging of the last capacitive element 108 of the multiple capacitive elements 108), the discharging switch 122 may transition from the open state to the closed state to cause concurrent discharging of the capacitive elements 108 and to concurrently activate respective optical emitters 106 connected to the capacitive elements 108. The multiple capacitive elements 108 may include two or more capacitive elements 108, which may include all of the capacitive elements 108 of the driver circuit 100 or fewer than all of the capacitive elements 108 of the driver circuit 100. Moreover, the multiple capacitive elements 108 may be associated with sequential rows of the driver circuit 100 or non-sequential rows of the driver circuit 100.

In some implementations, a controller for the array of optical emitters 106 may include the driver circuit 100 or a portion thereof. In addition, the controller may be configured to provide the charge signal, the enable signal, and/or the fire signal, as described herein. Furthermore, the controller may implement various control interface logic for the driver circuit 100. For example, the controller may include a low-voltage differential signaling (LVDS) interface, or one or more demultiplexers for selecting a channel (e.g., a row) of the driver circuit 100, or the like.

In some implementations, an optical source may include the driver circuit 100 or a portion thereof. In some implementations, an optical system may include the driver circuit 100 or a portion thereof. Moreover, the optical system may include one or more lenses, one or more optical elements (e.g., diffractive optical elements, refractive optical elements, or the like), one or more reflector elements, and/or one or more optical sensors, among other examples. In some implementations, the optical source or a portion thereof, the driver circuit 100 or a portion thereof, and/or the controller or a portion thereof may be included in (e.g., may be configured for use in) a LIDAR system.

According to some implementations, a method may include generating an optical pulse for LIDAR using the optical source or a portion thereof, the driver circuit 100 or a portion thereof, and/or the controller or a portion thereof; receiving a signal based on a reflection of the optical pulse from an object; and/or determining a distance and/or a velocity of the object based on the signal. According to some implementations, a method may include generating (or forming) an array of light spots for three-dimensional sensing using the optical source or a portion therefor, the driver circuit 100 or a portion thereof, and/or the controller or a portion thereof. According to some implementations, a method may include generating (or forming) a light pattern for three-dimensional sensing using the optical source or a portion therefor, the driver circuit 100 or a portion thereof, and/or the controller, described above, or a portion thereof.

As indicated above, FIG. 1 is provided as an example. Other examples may differ from what is described with regard to FIG. 1.

Figure 2:
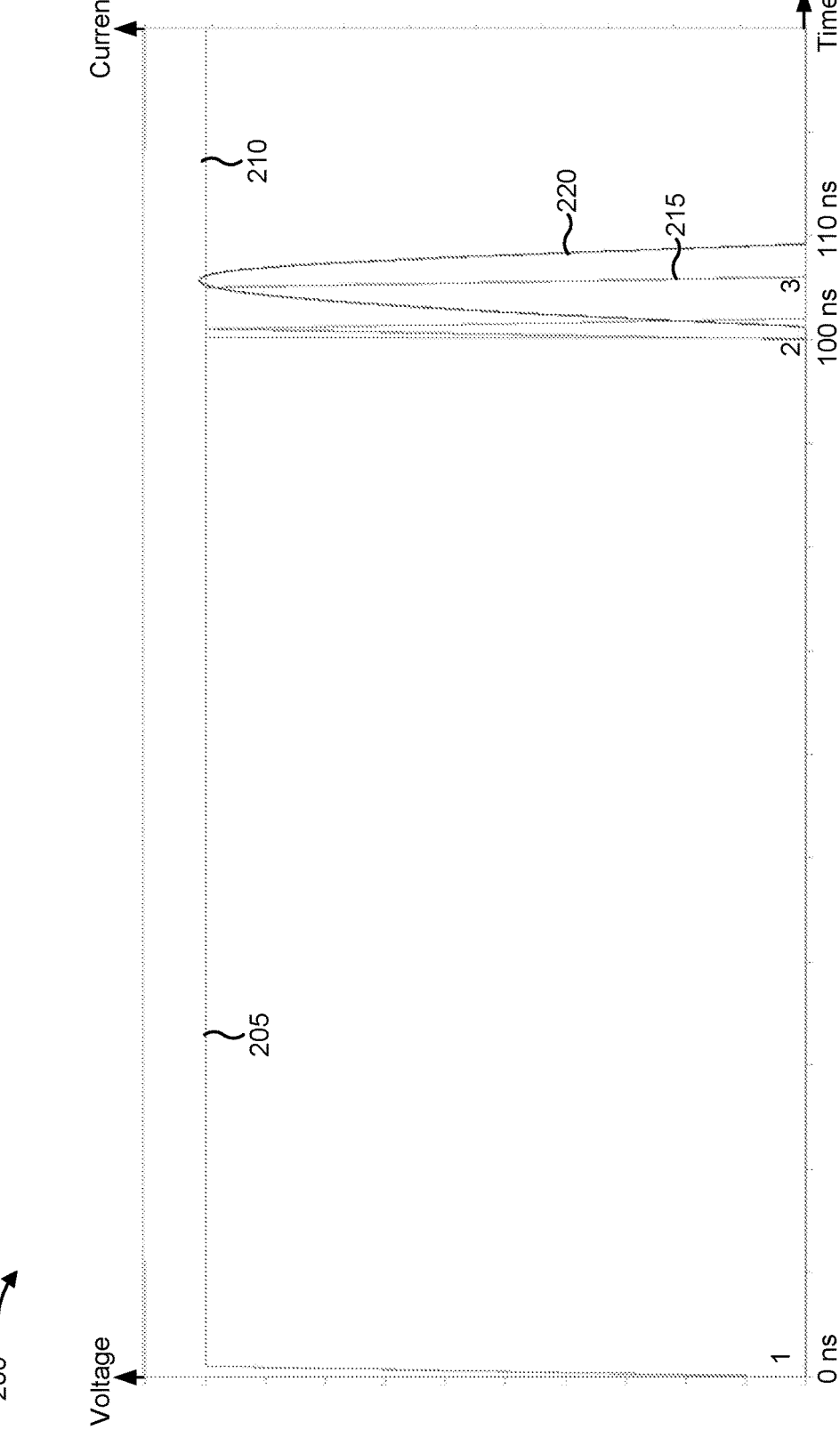
FIG. 2 is a diagram of an example graph plotting electrical signals associated with the driver circuit of FIG. 1.

FIG. 2 is a diagram of an example graph 200 plotting electrical signals associated with the driver circuit 100. The graph 200 shows the electrical signals associated with generating an optical pulse at an optical emitter 106 (e.g., optical emitter 106 A) of the array of optical emitters 106.

Line 205 shows the voltage of a charge signal for a charging switch 114. A pulse (shown as high voltage) of the charge signal causes the charging switch 114 to transition to the closed state (e.g., at a rising edge of line 205 at point 1). As shown, the pulse may have a duration (e.g., from point 1 to point 2) of 100 ns. The duration may be based on an inductance value of the inductive element 112, a capacitance value of the capacitive element 108 that is to be charged, and/or a voltage level that is to be on an anode of the optical emitter 106 that is to be illuminated. Closing of the charging switch 114, after the pulse (e.g., at a falling edge of line 205 at point 2), may cause discharging of the inductive element 112.

Line 210 shows the voltage of an enable signal for an enabling switch 116. As shown, the enable signal is an inverse of the charge signal. A pulse (shown as high voltage) of the enable signal causes the enabling switch 116 to transition to the closed state (e.g., at a rising edge of line 210 at point 2). Thus, when the charging switch 114 transitions from the closed state to the open state, the enabling switch 116 transitions from the open state to the closed state. Accordingly, closing the enabling switch 116 causes current discharged from the inductive element 112 to flow to a capacitive element 108 connected to the enabling switch 116.

Line 215 shows the voltage of a fire signal for the discharging switch 122. A pulse (shown as high voltage) of the fire signal causes the discharging switch 122 to transition to the closed state (e.g., at a rising edge of line 215 at point 2). As shown, the pulse of the fire signal may be concurrent with the pulse of the enable signal. Moreover, the pulse may have a duration (e.g., from point 2 to point 3) of less than 10 ns. The duration may be based on an optical pulse width (e.g., in time) that is desired for an optical emitter 106. The optical pulse width may be less than an optical pulse width that would otherwise occur if the capacitive element 108 were to be discharged completely (e.g., when the pulse of the fire signal is longer than a pulse width that is achievable for a capacitance value of the capacitive element 108). After the pulse of the fire signal (e.g., having a relatively shorter duration), the discharging switch 122 opens and drives the common cathode of the array of optical emitters 106 to high voltage, thereby reverse biasing all optical emitters 106 in the array. In this way, crosstalk across channels (e.g., rows) of the driver circuit 100 is reduced and after-pulses that follow the main pulse are reduced or eliminated. Line 220 shows the current of an electrical pulse at the optical emitter 106 resulting from discharging of the capacitive element 108.

As indicated above, FIG. 2 is provided as an example. Other examples may differ from what is described with regard to FIG. 2.

Figure 3:
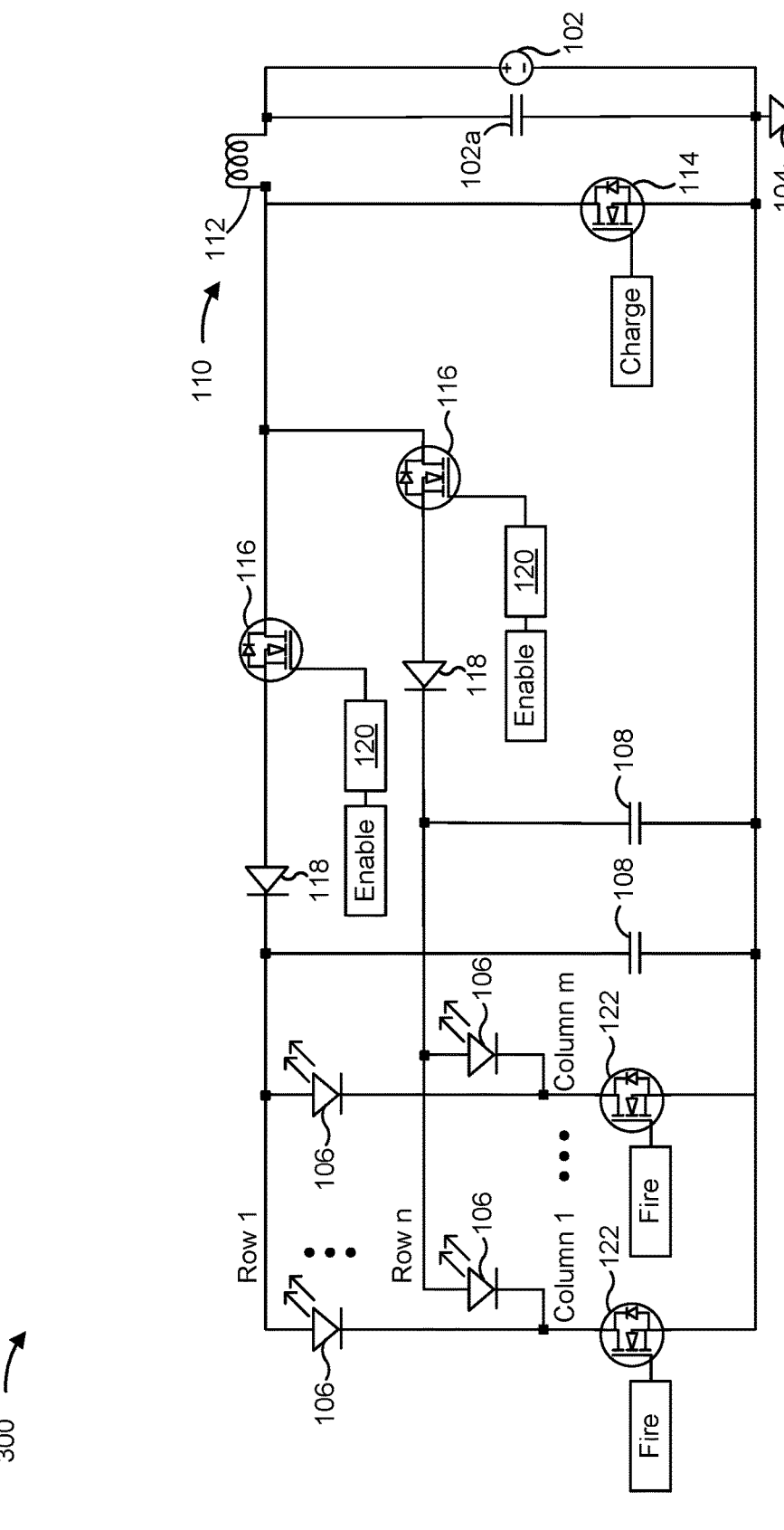
FIG. 3 is a diagram of an example driver circuit.

FIG. 3 is a diagram of an example driver circuit 300. The driver circuit 300 may be configured and may operate in a similar manner as the driver circuit 100 described in connection with FIG. 1. Accordingly, FIG. 3 uses the same reference numbers as FIG. 1 to identify the same or similar elements. As shown, the driver circuit 300 may include a two-dimensional array of optical emitters 106. The two-dimensional array of optical emitters 106 may be arranged into a plurality of rows (shown as rows 1 to n) and a plurality of columns (shown as columns 1 to m). As further shown, the driver circuit 300 may include a plurality of discharge switches 122 respectively connected to the plurality of columns (e.g., at cathode sides of the array of optical emitters 106), where a discharge switch 122 in the closed state selects a corresponding column to receive an electrical pulse from discharging of a capacitive element 108.

As indicated above, FIG. 3 is provided as an example. Other examples may differ from what is described with regard to FIG. 3.

FIG. 4 is a flowchart of an example process 400 associated with controlling a driver circuit (e.g., driver circuit 100) for an addressable array of optical emitters. In some implementations, one or more process blocks of FIG. 4 are performed by a controller (e.g., a controller that provides the charge, enable, and/or fire signals described in connection with FIG. 1). In some implementations, one or more process blocks of FIG. 4 are performed by another device or a group of devices separate from or including the controller.

As shown in FIG. 4, process 400 may include causing a first switch of a driver circuit to transition from an open state to a closed state to charge an inductive element of the driver circuit (block 410). For example, the controller may cause a first switch of a driver circuit to transition from an open state to a closed state to charge an inductive element of the driver circuit, as described above.

As further shown in FIG. 4, process 400 may include causing the first switch to transition from the closed state to the open state to discharge the inductive element, where the driver circuit is configured to cause the inductive element to discharge to any one of a plurality of capacitive elements of the driver circuit (block 420). For example, the controller may cause the first switch to transition from the closed state to the open state to discharge the inductive element, as described above. In some implementations, the driver circuit is configured to cause the inductive element to discharge to any one of a plurality of capacitive elements of the driver circuit.

As further shown in FIG. 4, process 400 may include causing a second switch of the driver circuit to transition from an open state to a closed state to select a capacitive element, of the plurality of capacitive elements, to be charged by discharging the inductive element (block 430). For example, the controller may cause a second switch of the driver circuit to transition from an open state to a closed state to select a capacitive element, of the plurality of capacitive elements, to be charged by discharging the inductive element, as described above.

As further shown in FIG. 4, process 400 may include causing a third switch of the driver circuit to transition from an open state to a closed state to discharge the selected capacitive element to provide an electrical pulse to an optical emitter, of an array of optical emitters of the driver circuit, that is connected to the selected capacitive element (block 440). For example, the controller may cause a third switch of the driver circuit to transition from an open state to a closed state to discharge the selected capacitive element to provide an electrical pulse to an optical emitter, of an array of optical emitters of the driver circuit, that is connected to the selected capacitive element, as described above.

Process 400 may include additional implementations, such as any single implementation or any combination of implementations described below and/or in connection with one or more other processes described elsewhere herein.

In a first implementation, the first switch is caused to transition from the closed state to the open state concurrently with causing the second switch to transition from the open state to the closed state.

In a second implementation, alone or in combination with the first implementation, the first switch is caused to transition from the open state to the closed state to charge the inductive element for a duration that is based on a capacitance value of the selected capacitive element.

In a third implementation, alone or in combination with one or more of the first and second implementations, the first switch is caused to transition from the open state to the closed state to charge the inductive element for a duration that is based on a length of a circuit path associated with the optical emitter, where the circuit path includes the optical emitter, the selected capacitive element, and the third switch.

In a fourth implementation, alone or in combination with one or more of the first through third implementations, a state of the first switch is controlled using a first signal, and a state of the second switch is controlled using a second signal that is an inverse of the first signal.

Although FIG. 4 shows example blocks of process 400, in some implementations, process 400 includes additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A driver circuit, comprising:
an array of vertical cavity surface emitting lasers (VCSELs);
a plurality of capacitive elements connected to respective VCSELs of the array of VCSELs;
an inductive element;
a first switch having an open state and a closed state,
wherein the first switch in the closed state is to cause a charging of the inductive element, and
wherein the first switch transitioning from the closed state to the open state is to cause a discharging of the inductive element;
a plurality of second switches, each having an open state and a closed state, between the inductive element and the plurality of capacitive elements,
wherein the plurality of second switches are connected to respective capacitive elements of the plurality of capacitive elements, and
wherein a second switch, of the plurality of second switches, in the closed state is to select a capacitive element, of the plurality of capacitive elements, that is to be charged by the discharging of the inductive element; and
a third switch, having an open state and a closed state, to control current to the array of VCSELs,
wherein the third switch in the closed state is to cause a discharging of the selected capacitive element to provide an electrical pulse to a VCSEL, of the array of VCSELs, that is connected to the selected capacitive element, and
wherein the first switch is configured to be in the closed state for a duration that is based on an inductance of a circuit path between the inductive element and the VCSEL.

2. The driver circuit of claim 1, further comprising:
a plurality of blocking diodes between the plurality of second switches and the plurality of capacitive elements.

3. The driver circuit of claim 1,
wherein the array of VCSELs is arranged in a plurality of rows, and
wherein the plurality of capacitive elements are configured to be respective voltage sources for the plurality of rows.

4. The driver circuit of claim 1,
wherein the duration is variable based on a capacitance value of a particular capacitive element, of the plurality of capacitive elements, that is to be charged by the discharging of the inductive element.

5. The driver circuit of claim 1,
wherein the duration is based on a length of the circuit path, and
wherein the circuit path includes the selected capacitive element and the third switch.

6. The driver circuit of claim 1,
wherein the first switch is configured to be controlled by a first signal, and
wherein the second switch is configured to be controlled by a second signal that is an inverse of the first signal.

7. The driver circuit of claim 1,
wherein the inductive element is configured to boost an input voltage of the driver circuit.

8. An optical source, comprising:
an array of optical emitters;

a plurality of capacitive elements connected to respective optical emitters of the array of optical emitters;
an inductive element;
a first switch having an open state and a closed state,
wherein the first switch in the closed state is to cause a charging of the inductive element, and
wherein the first switch transitioning from the closed state to the open state is to cause a discharging of the inductive element;
a plurality of second switches, each having an open state and a closed state, between the inductive element and the plurality of capacitive elements,
wherein the plurality of second switches are connected to respective capacitive elements of the plurality of capacitive elements, and
wherein a second switch, of the plurality of second switches, in the closed state is to select a capacitive element, of the plurality of capacitive elements, that is to be charged by the discharging of the inductive element; and
a third switch, having an open state and a closed state, to control current to the array of optical emitters,
wherein the third switch in the closed state is to cause a discharging of the selected capacitive element to provide an electrical pulse to an optical emitter, of the array of optical emitters, that is connected to the selected capacitive element, and
wherein the first switch is configured to be in the closed state for a duration that is based on an inductance of a circuit path between the inductive element and the optical emitter.

9. The optical source of claim 8,
wherein the duration is variable based on a capacitance value of a particular capacitive element, of the plurality of capacitive elements, that is to be charged by the discharging of the inductive element.

10. The optical source of claim 8,
wherein the duration is based on a length of the circuit path, and
wherein the circuit path includes the selected capacitive element and the third switch.

11. The optical source of claim 8,
wherein the first switch is configured to be controlled by a first signal, and
wherein the second switch is configured to be controlled by a second signal that is an inverse of the first signal.

12. The optical source of claim 8,
wherein the array of optical emitters is one dimensional.

13. The optical source of claim 8,
wherein the array of optical emitters is an array of vertical cavity surface emitting lasers (VCSELs).

14. The optical source of claim 8,
wherein the optical source is configured for use in a light detection and ranging (LIDAR) system.

15. A method, comprising:
causing, by a controller, a first switch of a driver circuit to transition from an open state to a closed state to charge an inductive element of the driver circuit;
causing, by the controller, the first switch to transition from the closed state to the open state to discharge the inductive element,
wherein the driver circuit is configured to cause the inductive element to discharge to any one of a plurality of capacitive elements of the driver circuit;
causing, by the controller, a second switch of the driver circuit to transition from an open state to a closed state to select a capacitive element, of the plurality of capacitive elements, to be charged by discharging the inductive element; and causing, by the controller, a third switch of the driver circuit to transition from an open state to a closed state to discharge the selected capacitive element to provide an electrical pulse to an optical emitter, of an array of optical emitters of the driver circuit, that is connected to the selected capacitive element, wherein the first switch is configured to be in the closed state for a duration that is based on an inductance of a circuit path between the inductive element and the optical emitter.

16. The method of claim 15, wherein the first switch is caused to transition from the closed state to the open state concurrently with causing the second switch to transition from the open state to the closed state.

17. The method of claim 15, wherein the duration is based on a capacitance value of the selected capacitive element.

18. The method of claim 15, wherein the duration is based on a length of the circuit path, and wherein the circuit path includes the selected capacitive element and the third switch.

19. The method of claim 15, wherein a state of the first switch is controlled using a first signal, and wherein a state of the second switch is controlled using a second signal that is an inverse of the first signal.

20. The method of claim 15, wherein the array of optical emitters is an array of vertical cavity surface emitting lasers (VCSELs).

* * * * *